(12) United States Patent
Sato

(10) Patent No.: US 11,557,873 B2
(45) Date of Patent: Jan. 17, 2023

(54) LIGHT EMITTING DEVICE

(71) Applicant: NICHIA CORPORATION, Anan (JP)

(72) Inventor: Daisuke Sato, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/483,375

(22) Filed: Sep. 23, 2021

(65) Prior Publication Data

US 2022/0102936 A1 Mar. 31, 2022

(30) Foreign Application Priority Data

Sep. 30, 2020 (JP) .............................. JP2020-166264

(51) Int. Cl.
| | | |
|---|---|---|
| *F21K 9/68* | (2016.01) | |
| *H01S 5/02208* | (2021.01) | |
| *F21K 9/64* | (2016.01) | |
| *H01S 5/40* | (2006.01) | |

(52) U.S. Cl.
CPC ............ *H01S 5/02208* (2013.01); *F21K 9/64* (2016.08); *F21K 9/68* (2016.08); *H01S 5/4087* (2013.01)

(58) Field of Classification Search
None
See application file for complete search history.

(56) References Cited

U.S. PATENT DOCUMENTS

| | | | |
|---|---|---|---|
| 8,104,923 B2 | 1/2012 | Nagai | |
| 8,876,327 B2 | 11/2014 | Ge et al. | |
| 2018/0239232 A1* | 8/2018 | Yasumatsu | ......... G03B 21/2066 |

FOREIGN PATENT DOCUMENTS

| | | |
|---|---|---|
| JP | 2010-506379 A | 2/2010 |
| JP | 2015-022955 A | 2/2015 |
| JP | 2017-212390 A | 11/2017 |
| WO | WO-2012/053070 A1 | 4/2012 |

* cited by examiner

*Primary Examiner* — Elmito Breval
(74) *Attorney, Agent, or Firm* — Foley & Lardner LLP

(57) ABSTRACT

A light emitting device includes: a base portion comprising: an upward-facing surface, and a frame defining an inner lateral surface; a plurality of semiconductor laser elements arranged on the upward-facing surface and surrounded by the frame; a cover portion supported by the frame and disposed above the plurality of semiconductor laser elements; and a protrusion extending from a lower surface of the cover portion toward the upward-facing surface. Light emitted from each of the plurality of semiconductor laser elements is incident on a lateral surface of the protrusion, passes through the protrusion, is reflected at the boundary surface, and is transmitted through the cover portion.

20 Claims, 8 Drawing Sheets

LIGHT EMITTING DEVICE

CROSS-REFERENCE TO RELATED APPLICATION

This application claims priority to Japanese Patent Application No. 2020-166264, filed on Sep. 30, 2020, the entire contents of which are hereby incorporated by reference in their entirety.

BACKGROUND

The present disclosure relates to a light emitting device.

There is known a light emitting device including a semiconductor laser element. In one example, JP 2017-212390 A discloses a light emitting device including a semiconductor laser element that is disposed on a first surface and configured to emit a laser beam in a first direction along the first surface, and a prism having an incident surface on which the laser beam emitted from the semiconductor laser element is incident and a reflecting surface that reflects at least a part of the laser beam having been incident on the incident surface. In this light emitting device, where the base of natural logarithm is "e," the reflecting surface of the prism is oriented to totally reflect a laser beam having a light intensity equal to or greater than $1/e^2$ of a central light intensity of laser beams among the laser beams having entered the prism through the incident surface.

SUMMARY

An object of the present disclosure is to provide a light emitting device that can be miniaturized.

A light emitting device according to an embodiment of the present disclosure includes a base portion including: an upward-facing surface, and a frame defining a lateral surface; a plurality of semiconductor laser elements arranged on the upward-facing surface and surrounded by the frame; a cover portion supported by the frame and disposed above the plurality of semiconductor laser elements; and one protrusion extending from a surface of the cover portion on the plurality of semiconductor laser elements side toward the upward-facing surface side. Light emitted from each of the plurality of semiconductor laser elements is incident on a lateral surface of the protrusion, passes through in the protrusion, is reflected at the boundary surface of the protrusion, and is transmitted through the cover portion.

According to an embodiment of the present disclosure, a light emitting device that can be miniaturized can be provided.

DETAILED DESCRIPTION

Figure 1:
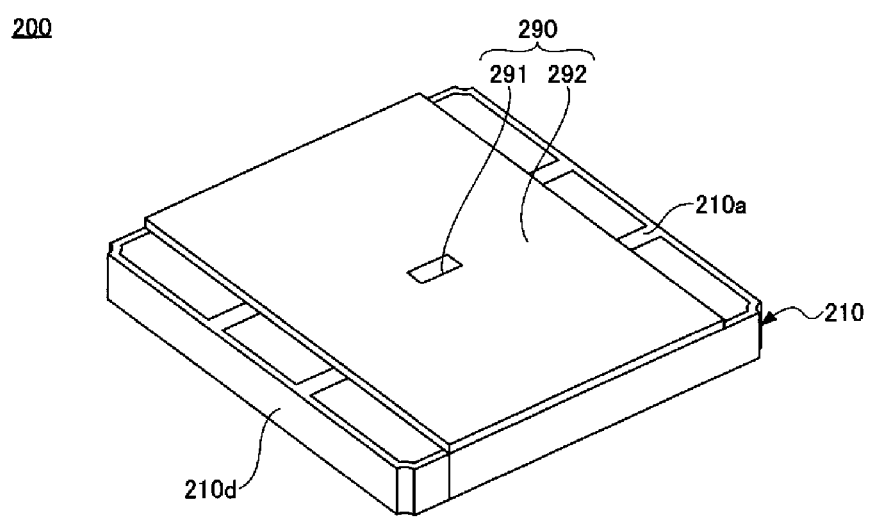
FIG. 1 is a schematic perspective view exemplifying a light emitting device according to a first embodiment.

Hereinafter, certain embodiments of the present invention will be described with reference to the drawings. In the description below, terms indicating a specific direction or position (e.g., "upper," "lower," and other terms including those terms) are used when necessary. Those terms are used to facilitate understanding of the invention with reference to the drawings, and the technical scope of the invention is not limited by the meaning of those terms. In addition, portions designated with the same reference numerals in a plurality of drawings indicate identical or equivalent parts or members.

In this disclosure, as for polygonal shapes such as triangles and quadrangles, the term "polygonal shape" includes polygonal shapes with rounded corners, obtuse-angled corners, recessed corners formed by straight lines and/or curved lines, etc. Further, not only shapes with modification in corners (ends of sides), but also shapes with modification in an intermediate portion of a side are similarly referred to as "polygonal shapes." In other words, a polygonal-based shape with partial modification is included in the interpretation of "polygonal shape" described in this disclosure.

The same applies not only to polygonal shapes but also to terms representing specific shapes such as trapezoids, circles, protrusions, and recessions. Further, the same applies in descriptions of each side forming that shape. In other words, even when a corner or an intermediate portion of a side is modified, the interpretation of "side" includes such a modified portion. When a "polygonal shape" or a "side" without partial modification is to be distinguished from a shape with modification, "strict" will be added to the description, such as "strict quadrangle."

Furthermore, the embodiments to be described below exemplify light emitting devices and the like for giving a concrete form to the technical idea of the present invention, and the present invention is not limited to the description below. In addition, unless otherwise specified, the dimensions, materials, shapes, relative arrangements, and the like of constituent elements described below are not intended to limit the scope of the present invention to those, but are intended to show examples. The contents described in one embodiment can be applied to other embodiments and modified examples. The size, positional relationship, and the like of the members illustrated in the drawings may be exaggerated in order to clarify the explanation. Furthermore, in order to avoid excessive complication of the drawings, a schematic view in which some elements are not illustrated may be used, or an end view illustrating only a cutting surface may be used as a cross-sectional view.

First Embodiment

Figure 2:
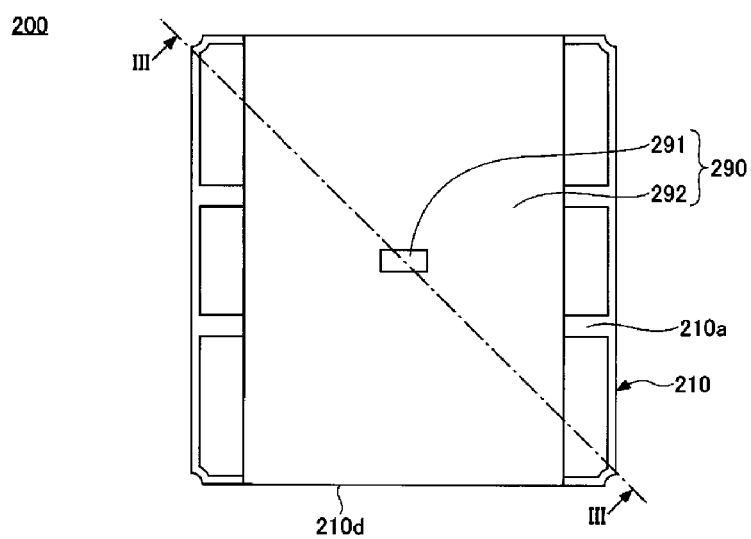
FIG. 2 is a schematic plan view exemplifying the light emitting device according to the first embodiment.
Figure 3:
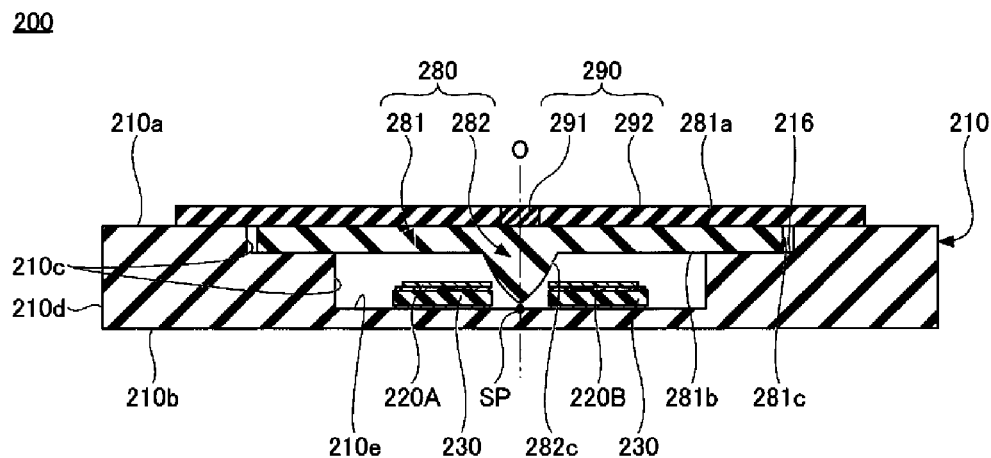
FIG. 3 is a schematic cross-sectional view exemplifying the light emitting device according to the first embodiment.
Figure 4:
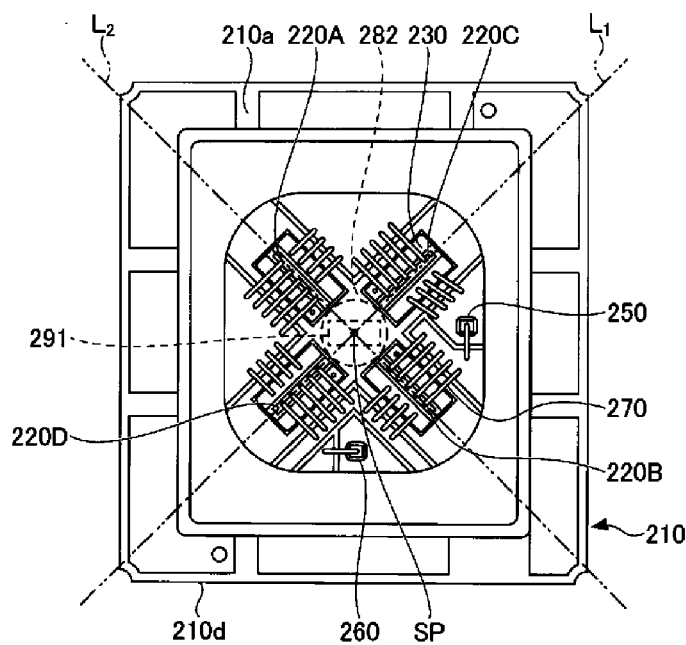
FIG. 4 is a schematic plan view exemplifying the light emitting device according to the first embodiment from which a wavelength conversion member and an optical member are removed.

FIG. 1 is a schematic perspective view exemplifying a light emitting device according to a first embodiment. FIG. 2 is a schematic plan view exemplifying the light emitting device according to the first embodiment. FIG. 3 is a schematic cross-sectional view exemplifying the light emitting device according to the first embodiment, and illustrates a cross-section taken along line in FIG. 2. FIG. 4 is a schematic plan view exemplifying the light emitting device according to the first embodiment from which a wavelength conversion member and an optical member are removed. In FIG. 4, for convenience, positions at which a protrusion 282 and a wavelength conversion portion 291 are projected are indicated by dashed lines.

As illustrated in FIG. 1 to FIG. 4, a light emitting device 200 includes a base portion 210, a plurality of semiconductor laser elements (first semiconductor laser element 220A, a second semiconductor laser element 220B, a third semiconductor laser element 220C, and a fourth semiconductor laser element 220D), a plurality of submounts 230, a protecting element 250, a temperature measuring element 260, wirings 270, an optical member 280, and a wavelength conversion member 290. The light emitting device 200 may not include all of these components. For example, the light emitting device 200 may include at least the base portion 210, the plurality of semiconductor laser elements 220, and the optical member 280.

Components of the light emitting device 200 will be described.

Base Portion 210

The base portion 210 includes an upper surface 210a, a lower surface 210b, a plurality of inner lateral surfaces 210c, one or more outer lateral surfaces 210d, and an upward-facing surface 210e. The base portion 210 has a recessed shape recessed in the direction from the upper surface 210a to the lower surface 210b. The base portion 210 has an outer shape of a rectangular shape in planar view, and a recess is formed inward of the outer shape.

In addition, in a plan view, the one or more inner lateral surfaces 210c intersecting the upper surface 210a form a frame. In other words, the base portion 210 includes the upward-facing surface 210e and the frame forming the plurality of inner lateral surfaces 210c extending toward the upward-facing surface 210e. The recess in the base portion 210 is surrounded by the upward-facing surface 210e and the frame.

Viewing a target object in the normal direction with respect to the upper surface 210a of the base portion 210 may be referred to as a "plan view," and a shape of the target object when viewed in the normal direction with respect to the upper surface 210a of the base portion 210 may be referred to as a "planar shape."

The base portion 210 includes one or more stepped portions 216 inward of the frame. Each of the one or more stepped portions 216 is constituted only of an upper surface and a lateral surface intersecting the upper surface and extending downward. The one or more inner lateral surfaces 210c include a lateral surface meeting the lower surface 210e of the base portion 210 and a lateral surface of the stepped portion 216.

The base portion 210 can be formed, for example, of ceramics as a main material. For example, aluminum nitride, silicon nitride, aluminum oxide, or silicon carbide can be used as the ceramics. The base portion 210 is not limited to ceramics, and may be formed using other materials having insulating properties as a main material.

One or more metal films are provided on the upward-facing surface 210e of the base portion 210. One or more metal films are provided on the upper surface 210a of the base portion 210. In addition, the one or more metal films provided on the upward-facing surface 210e includes a metal film electrically connected to the metal film provided on the upper surface 210a. For example, the metal film disposed on the upward-facing surface 210e and the metal film disposed on the upper surface 210a are electrically connected via a metal film provided through a via hole.

The frame of the base portion 210 may extend continuously from, for example, a plane surrounding the upward-facing surface 210e and located below the upward-facing surface 210e, instead of extending continuously from the upward-facing surface 210e. The base portion 210 may be, for example, formed of a plate-like member and a frame bonded onto the plate-like member, instead of being integrally formed. The base portion 210 can also be formed using a material having electrical conductivity such as a metal as the main material.

Semiconductor Laser Element 220

The semiconductor laser elements 220 include the first semiconductor laser element 220A, the second semiconductor laser element 220B, the third semiconductor laser element 220C, and the fourth semiconductor laser element 220D. However, this is an example, and the light emitting device 200 may include two or more semiconductor laser elements. When the first semiconductor laser element 220A, the second semiconductor laser element 220B, the third semiconductor laser element 220C, and the fourth semiconductor laser element 220D are not particularly required to be distinguished from each other, they are simply referred to as semiconductor laser elements 220.

Each of the semiconductor laser elements 220 has, for example, an outer shape of a rectangle in a plan view. A lateral surface defining one of two short sides of the rectangle is an emission end surface of light emitted from the semiconductor laser element 220. An upper surface and a lower surface of each semiconductor laser element 220 have areas larger than an area of the emission end surface.

The light (laser beam) emitted from each semiconductor laser element 220 spreads and forms a far field pattern (hereinafter referred to as an "FFP") of an elliptical shape in a plane parallel to the emission end surface of the light. As used herein, the FFP indicates a shape and a light intensity distribution of the emitted light at a position apart from the emission end surface.

Based on the light of elliptical shape emitted from the semiconductor laser element 220, in the present specification, a direction passing through the major axis of the elliptical shape will be referred to as a "fast axis direction of the FFP," and a direction passing through the minor axis of the elliptical shape will be referred to as a "slow axis direction of the FFP." The fast axis direction of the FFP in the semiconductor laser element 220 may coincide with a layering direction in which a plurality of semiconductor layers including an active layer of the semiconductor laser element 220 are layered.

Also, based on the light intensity distribution of the FFP of the semiconductor laser element 220, light having an intensity of $1/e^2$ or greater relative to a peak intensity value will be referred to as "main portion of light." In this light intensity distribution, an angle corresponding to the intensity of $1/e^2$ will be referred to as a "spread angle." The spread angle of the FFP in the fast axis direction is greater than the spread angle of the FFP in the slow axis direction.

For the semiconductor laser element 220, a semiconductor laser element in which an emission peak wavelength of light emitted from the semiconductor laser element 220 is in a range of 320 nm to 530 nm, typically in a range of 430 nm to 480 nm can be used. Examples of such the semiconductor laser element 220 include a semiconductor laser element including a nitride semiconductor. For the nitride semiconductor, for example, GaN, InGaN, or AlGaN can be used. The emission peak of the light emitted from the semiconductor laser element 220 is not necessarily in the range described above. The semiconductor laser element 220 may emit light having wavelength outside the wavelength range described above. For example, the light emitted from the semiconductor laser element 220 can be appropriately determined within the range of visible light. The emission peak wavelengths of the light emitted from the first semiconductor laser element 220A, the second semiconductor laser element 220B, the third semiconductor laser element 220C, and the fourth semiconductor laser element 220D are, for example, the same. The expression "the same" described herein includes a case in which the difference between the emission peak wavelengths is 10 nm or less.

Submount 230

The submount 230 has, for example, a rectangular parallelepiped shape with a lower surface, an upper surface, and lateral surfaces. The submount 230 has the smallest width in the vertical direction. The submount 230 may have a shape other than a rectangular parallelepiped shape. For the submount 230, for example, aluminum nitride or silicon carbide can be used, although other materials may be used. A metal film is disposed on the upper surface of the submount 230.

Protecting Element 250

The protecting element 250 serves to prevent specific elements such as semiconductor laser elements from being broken by an excessive current flowing therethrough. For example, a Zener diode formed of Si can be used as the protecting element 250.

Temperature Measuring Element 260

The temperature measuring element 260 is an element to be used as a temperature sensor for measuring the ambient temperature. For example, a thermistor can be used for the temperature measuring element 260.

Wirings 270

The wirings 270 are used for electrical connection between two components. For example, a metal wire can be used as each wiring 270.

Optical Member 280

The optical member 280 includes a cover portion 281 and a protrusion 282.

The cover portion 281 includes an upper surface 281a, a lower surface 281b that is opposite the upper surface, and one or more lateral surfaces 281c meeting the upper surface 281a and the lower surface 281b. Each of the one or more lateral surfaces 281c connects an outer edge of the upper surface 281a and an outer edge of the lower surface 281b. The cover portion 281 has, for example, a rectangular parallelepiped shape or a cubic shape. In this case, both the upper surface 281a and the lower surface 281b of the cover portion 281 have a rectangular shape, and the cover portion 281 includes four lateral surfaces 281c each having a rectangular shape.

However, the cover portion 281 may have a shape other than a rectangular parallelepiped shape or a cubic shape. In other words, a planar shape of the cover portion 281 is not limited to the rectangular shape, and it can have any shape such as a circular shape, an oval shape, and a polygonal shape.

The protrusion 282 protrudes downward from the lower surface 281b of the cover portion 281. The protrusion 282 is a light-transmissive member including a lateral surface 282c and having a downwardly protruding shape. In the example illustrated in FIG. 3, the lateral surfaces 282c of the protrusion 282 meets the lower surface 281b of the cover portion 281.

A central axis O of the protrusion 282 is, for example, orthogonal to the lower surface 281b of the cover portion 281. The central axis O can be, for example, a virtual straight line connecting a centroid at a cutting surface of the protrusion 282 taken parallel to the lower surface 281b at an arbitrary position of the protrusion 282 and a centroid of the cutting surface of the protrusion 282 taken parallel to the lower surface 281b at a position different from the arbitrary position. These two centroids do not overlap with each other.

The protrusion 282 has a shape that increases in width from the lower side to the upper side (the cover portion side) in any vertical cross-sectional view passing through the central axis O of the protrusion 282. The protrusion 282 is, for example, rotationally symmetric with respect to the central axis O.

The protrusion 282 has, for example, a conical shape or a truncated conical shape protruding downward from the lower surface 281b of the cover portion 281. In the example herein, the terms "conical shape" and "truncated conical shape" includes not only a shape that is strictly the conical shape or the truncated conical shape but also, for example, a circular-cone-like shape or truncated circular-conical shape having a lateral surface that is curved in a cross-sectional view. In the present embodiment, in one example, the protrusion 282 has a truncated conical shape, and the lateral surface 282c of the protrusion 282 has a curved shape curved outward in a cross-sectional view.

The cover portion 281 and the protrusion 282 are, for example, integrally formed using glass as a main material. The cover portion 281 and the protrusion 282 may be separate from each other, and may be bonded together by a light-transmissive adhesive and the like. In this case, for example, the optical member 280 can be formed by providing the cover portion 281 having a plate-like shape with the upper surface 281a and the lower surface 281b, and the protrusion 282 having a convex shape with an upper surface and the lateral surface 282c, and bonding the upper surface of the protrusion 282 to the lower surface 281b of the cover portion 281. In this case, the cover portion 281 can be formed using, for example, a light-transmissive material containing glass, sapphire, silicon carbide, or the like as the main material. The protrusion 282 can be formed using, for example, glass as a main material. Examples of the glass to be used as a main material of the protrusion 282 include quartz, borosilicate glass, and the like.

Alternatively, a through-hole may be formed at a predetermined position in the cover portion 281 having the plate-like shape, the protrusion 282 may be partially inserted into the through-hole, and an inner lateral surface defining the through-hole and a portion of the lateral surface 282c of the protrusion 282 may be bonded in a state in which a portion of the protrusion 282 protrudes downward from the cover portion 281. In this case, for a main material of the cover portion 281, while a light-transmissive material containing, for example, glass, sapphire, silicon carbide, or the like can be used, a light blocking material including metal and the like may also be used. In this case as well, the protrusion 282 can be formed using a light-transmissive material such as glass as the main material.

Wavelength Conversion Member 290

The wavelength conversion member 290 includes a wavelength conversion portion 291 and a light reflecting portion 292. The wavelength conversion portion 291 has an upper surface, a lower surface that is opposite the upper surface, and one or more lateral surfaces meeting the upper surface and the lower surface. Each of the one or more lateral surfaces connects an outer edge of the upper surface and an outer edge of the lower surface. The wavelength conversion portion 291 has, for example, a rectangular parallelepiped shape or a cubic shape. In this case, both the upper surface and the lower surface of the wavelength conversion portion 291 have a rectangular shape, and the wavelength conversion portion 291 includes four lateral surfaces having rectangular shapes. The description of "rectangular shape" described here refers to a rectangle or a square.

However, the wavelength conversion portion 291 may have other shape than the rectangular parallelepiped or cubic shape. In other words, a planar shape of the wavelength conversion portion 291 may be other shape than the rectangular shape, and can be any appropriate shape such as a circular shape, an oval shape, or a polygonal shape.

The wavelength conversion portion 291 can convert light incident on the lower surface into light having a different wavelength, and can emit the converted light through the upper surface thereof. The wavelength conversion portion 291 may emit a portion of the incident light. The wavelength conversion portion 291 may convert an entirety of the incident light into light having the different wavelength. In this case, light having the wavelength of the light incident on the wavelength conversion portion 291 is not emitted from the wavelength conversion portion 291. The wavelength conversion portion 291 can be formed of a main material and a phosphor contained in the main material.

The wavelength conversion portion 291 is to be irradiated with light, and thus is preferably formed using an inorganic material that is not easily decomposed by irradiation of light as the main material. Examples of the main material include ceramics. Examples of the ceramics used for the main material include aluminum oxide, aluminum nitride, silicon oxide, yttrium oxide, zirconium oxide, and magnesium oxide. The main material of the ceramic is preferably selected from a material having a melting point in a range of 1300° C. to 2500° C. so that deterioration such as thermal deformation or discoloration does not occur in the wavelength conversion portion 291. The wavelength conversion portion 291 is, for example, a sintered body formed using the ceramics as the main material.

The wavelength conversion portion 291 can be formed by sintering, for example, a phosphor and a light-transmissive material such as aluminum oxide. The content of the phosphor can be in a range of 0.05 vol % to 50 vol % with respect to the total volume of the ceramics. Furthermore, for example, a ceramic made of substantially only a phosphor in which the powder of the phosphor is sintered may be used. Furthermore, the wavelength conversion portion 291 may be formed of a single crystal of a phosphor.

Examples of the phosphor include yttrium aluminum garnet (YAG) activated with cerium, lutetium aluminum garnet (LAG) activated with cerium, silicate ((Sr, Ba)$_2$SiO$_4$) activated with europium, αSiAlON phosphor, βSiAlON phosphor, and the like. Among them, the YAG phosphor has good heat resistance.

For example, in a case in which the wavelength conversion portion 291 includes the YAG phosphor, when blue excitation light is incident on the lower surface of the wavelength conversion portion 291, the blue excitation light and fluorescence are combined to emit white light from the upper surface of the wavelength conversion portion 291.

The light reflecting portion 292 is, for example, a frame-shaped member defining an aperture having a rectangular shape. The light reflecting portion 292 has an upper surface, a lower surface that is opposite the upper surface, one or more inner lateral surfaces connecting an inner edge of the upper surface and an inner edge of the lower surface, and one or more outer lateral surfaces connecting an outer edge of the upper surface and an outer edge of the lower surface. The outer edges and the inner edges of the upper surface form, for example, rectangular shapes, and the outer edges and the inner edges of the lower surface form, for example, rectangular shapes. In this case, the light reflecting portion 292 includes four inner lateral surfaces each having a rectangular shape and four outer lateral surfaces each having a rectangular shape. However, the outer edges and the inner edges of the upper surface, and the outer edges and the inner edges of the lower surface may form shapes other than rectangular shapes, and may form any appropriate shapes such as circular shapes, oval shapes, or polygonal shapes.

The light reflecting portion 292 is, for example, a sintered body formed using ceramics for a main material. The ceramics used for the main material include, for example, aluminum oxide, aluminum nitride, silicon oxide, yttrium oxide, zirconium oxide, and magnesium oxide. Among them, aluminum oxide is preferable in view of having high reflectivity. For the light reflecting portion 292, ceramics is not necessarily used as a main material. The light reflecting portion 292 may be formed using, for example, a metal, or a composite of ceramics and a metal.

In the wavelength conversion member 290, the inner lateral surfaces of the light reflecting portion 292 are connected to the lateral surfaces of the wavelength conversion portion 291. The wavelength conversion member 290 has a flat plate shape such as a rectangular parallelepiped shape.

The upper surface of the wavelength conversion portion 291 and the upper surface of the light reflecting portion 292 may be, for example, in a single continuous plane. The lower surface of the wavelength conversion portion 291 and the lower surface of the light reflecting portion 292 may be, for example, in a single continuous plane. The upper surface and/or the lower surface of the wavelength conversion portion 291 may have a shape protruding with respect to the upper surface and/or the lower surface of the light reflecting portion 292. In this case, a portion of the lateral surface of the wavelength conversion portion 291 is connected to the inner lateral surface of the light reflecting portion 292.

In the wavelength conversion member 290, the wavelength conversion portion 291 and the light reflecting portion 292 can be integrally formed with each other. The wavelength conversion member 290 may be formed by separately forming the wavelength conversion portion 291 and the light reflecting portion 292 and bonding them together. The wavelength conversion portion 291 and the light reflecting portion 292 are, for example, integrally formed of a sintered body. For example, the integrated sintered body can be formed by forming the sintered body of the wavelength conversion portion 291, and then forming the sintered body of the light reflecting portion 292 integrally with the wavelength conversion portion 291. At this time, in each of the step of forming the wavelength conversion portion 291 and the step of forming the light reflecting portion 292, a ratio of voids (porosity) contained in the sintered body to be formed can also be adjusted. The porosity can be adjusted by adjusting a sintering condition (sintering temperature, sintering time, rate of temperature increase), particle size of materials, concentration of a sintering aid, and the like.

For example, in a case in which the wavelength conversion portion 291 and the light reflecting portion 292 are formed using the same ceramic as the main material, the porosity of the light reflecting portion 292 is made greater than the porosity of the wavelength conversion portion 291. In other words, a composite member 13 is formed such that the light reflecting portion 292 includes more voids than those in the wavelength conversion portion 291. In this case, it is preferable to adjust the sintering conditions so that the porosity of the light reflecting portion 292 is approximately 10%. With such a porosity, air is at the boundary between a lateral surface of the wavelength conversion portion 291 and an inner lateral surface of the light reflecting portion 292, so that a reflecting region is generated at the boundary. Light traveling from the wavelength conversion portion 291 side and incident on an inner lateral surface of the light reflecting portion 292 can be reflected at the reflecting region to the wavelength conversion portion 291 side.

Light Emitting Device 200

The protecting element 250 and the temperature measuring element 260 are arranged on the upward-facing surface 210e of the base portion 210. The protecting element 250 is disposed on and bonded to the metal film disposed on the upward-facing surface 210e of the base portion 210. The temperature measuring element 260 is disposed on and bonded to the metal film disposed on the upward-facing surface 210e of the base portion 210.

A plurality of submounts 230 (four submounts 230 in FIG. 4) are arranged on the upward-facing surface 210e of the base portion 210. The lower surface of each of the plurality of submounts 230 is bonded to the upward-facing surface 210e of the base portion 210. Each of the plurality of submounts 230 is oriented such that, for example, in a plan view, the longitudinal direction of each of the plurality of submounts 230 is parallel to the diagonal direction of the base portion 210. The plurality of submounts 230 can include two submounts 230 arranged on a diagonal line of the base portion 210 in a plan view. Of the plurality of submounts 230, respective two submounts 230 may be arranged on a respective one of a plurality of diagonal lines of the base portion 210. The plurality of submounts 230 can be arranged at equal intervals from the central axis O.

The plurality of semiconductor laser elements 220 are arranged on the upward-facing surface 210e of the base portion 210. More specifically, the plurality of the semiconductor laser elements 220 are disposed on the plurality of submounts 230. In the example of the light emitting device 200 illustrated in FIG. 4, each of the first semiconductor laser element 220A, the second semiconductor laser element 220B, the third semiconductor laser element 220C, and the fourth semiconductor laser element 220D is disposed on the upper surface of a respective one of the submounts 230. The lower surface of each of the submounts 230 is bonded to the upward-facing surface 210e of the base portion 210.

The first semiconductor laser element 220A, the second semiconductor laser element 220B, the third semiconductor laser element 220C, and the fourth semiconductor laser element 220D are arranged, for example, in point symmetry with respect to a point SP illustrated in FIG. 3 and FIG. 4. The point SP is located on a line that is an extension of the central axis O of the protrusion 282 toward the upward-facing surface 210e of the base portion 210. In other words, the point SP coincides with the center (or the central axis O) of the protrusion 282 in a plan view. It is not necessary to arrange the plurality of semiconductor laser elements 220 in point symmetry with respect to the point SP. For example, the plurality of semiconductor laser elements 220 can be arranged asymmetrically with respect to the point SP to allow adjustment in the beam shape of the light emitted from the light emitting device 200.

In the semiconductor laser element 220, the emission end surface is neither parallel to nor perpendicular to the inner lateral surface 210c and the outer lateral surface 210d of the base portion 210 in a plan view. In other words, the semiconductor laser element 220 is disposed such that the emission end surface is oblique with respect to the inner lateral surfaces 210c and the outer lateral surfaces 210d of the base portion 210 in a plan view. The semiconductor laser element 220 is disposed such that, for example, the emission end surface is at 45 degrees with respect to any of the inner lateral surfaces 210c and the outer lateral surfaces 210d of the base portion 210 in a plan view.

When the upward-facing surface 210e of the base portion 210 is bisected by a virtual first straight line passing through the protrusion 282 in a plan view, the first semiconductor laser element 220A is located in one of the bisected regions and the second semiconductor laser element 220B is located in the other one of the bisected regions. Referring to FIG. 4, for example, $L_1$ can be the first straight line. A virtual second straight line connecting the first semiconductor laser element 220A and the second semiconductor laser element 220B passes through the protrusion 282. Referring to FIG. 4, for example, $L_2$ can be the second straight line.

When the upward-facing surface 210e of the base portion 210 is bisected by a virtual third straight line passing through the protrusion 282 in a plan view, the third semiconductor laser element 220C is located in one of the bisected regions and the fourth semiconductor laser element 220D is located in the other one of the bisected regions. Referring to FIG. 4, for example, $L_2$ can be the third straight line. A virtual fourth straight line connecting the third semiconductor laser element 220C and the fourth semiconductor laser element 220D passes through the protrusion 282. Referring to FIG. 4, for example, $L_1$ can be the fourth straight line.

The two-dot chain line $L_1$ illustrated in FIG. 4 is an example of the virtual first straight line and fourth straight line, and the two-dot chain line $L_2$ is an example of the virtual second straight line and third straight line. All of the first straight line to the fourth straight line pass through the central axis O of the protrusion 282. However, in other embodiments, the first straight line to the fourth straight line do not pass through the central axis O. The first straight line and the second straight line are orthogonal to each other. However, in other embodiments, the first straight line and the second straight line are not orthogonal to each other. The third straight line and the fourth straight line are orthogonal to each other. However, in other embodiments, the third straight line and the fourth straight line are not orthogonal to each other. The first straight line and the fourth straight line are not necessarily on the same straight line. The second straight line and the third straight line are not necessarily on the same straight line.

The submount 230 on which the semiconductor laser element 220 is disposed serves as a heat dissipation member that dissipates heat generated from the semiconductor laser element 220 in the light emitting device 200. To function the submount 230 as the heat dissipation member, the submount 230 may be formed of a material having a thermal conductivity better than that of the semiconductor laser element 220.

Furthermore, the submount 230 can serve to adjust an emitting position of the light of the semiconductor laser element 220 in the light emitting device 200. The submount 230 can be used as an adjustment member when, for example, causing light passing through an optical axis of the semiconductor laser element 220 to be parallel to the upward-facing surface 210e and causing light from the semiconductor laser element 220 to be irradiated at a predetermined position on the protrusion 282. The term "parallel" as used herein allows a difference within ±3 degrees.

The semiconductor laser element 220, the protecting element 250, and the temperature measuring element 260 are electrically connected to the metal film disposed on the upward-facing surface 210e of the base portion 210 via corresponding wirings 270. The metal film disposed on the upward-facing surface 210e of the base portion 210 is used for electrical connection between these elements and an external power source. Thus, these elements and the external power supply can be electrically connected via the metal film on the lower surface 210e of the base portion 210.

The optical member 280 is disposed on the upper surface side of the base portion 210. More specifically, the cover portion 281 of the optical member 280 is supported by the frame of the base portion 210 and is located above the plurality of semiconductor laser elements 220 surrounded by the frame. The outer periphery of the lower surface 281b of the cover portion 281 is bonded to, for example, an upper surface of the stepped portion 216 of the base portion 210.

The cover portion 281 is bonded to the base portion 210, so that a closed space is formed in which the semiconductor laser element 220 is arranged. This closed space is, for example, in a hermetically sealed state. Such hermetic sealing allows for preventing organic matter and the like from being attracted onto the emission end surface of the light of the semiconductor laser element 220.

The protrusion 282 of the optical member 280 is a single protrusion protruding from the lower surface 281b, which is the surface of the cover portion 281 on the semiconductor laser element 220 side, toward the upward-facing surface 210e side of the base portion 210. A distal end portion (end portion on the upward-facing surface 210e side) of the protrusion 282 is located (on the upward-facing surface 210e side) below the emitting end surface of the semiconductor laser element 220. In view of reducing the height of the light emitting device 200, the closer the distal end portion of the protrusion 282 is located to the upward-facing surface 210e, the more preferable.

The wavelength conversion member 290 is disposed above the cover portion 281. In other words, the wavelength conversion member 290 is disposed on the upper surface 281a side of the cover portion 281 of the optical member 280. The outer peripheral portion of the light reflecting portion 292 of the wavelength conversion member 290 is bonded to, for example, the upper surface 210a of the base portion 210, which is located above the upper surface 281a of the cover portion 281. In the wavelength conversion member 290, there is a gap between the lower surface of the wavelength conversion portion 291 and each of the lower surface of the light reflecting portion 292 and the upper surface 281a of the cover portion 281, and are not in contact with each other. With this arrangement, a mounting position of each of the optical member 280 and the wavelength conversion member 290 can be easily adjusted. The cover portion 281 of the optical member 280 preferably has a thickness (in other words, the height of the cover portion 281 from the lower surface 281b to the upper surface 281a) equal to or less than a height of the stepped portion 216 (in other words, a width of the lateral surfaces of the stepped portion 216). The wavelength conversion portion 291 has the central axis O, and is located at a position overlapping the protrusion 282 in a plan view.

A mechanism of detecting destruction may be provided on the lower surface side of the light reflecting portion 292. The mechanism of detecting destruction can be realized, for example, with a wiring pattern having a predetermined shape provided on the lower surface side of the light reflecting portion 292. For example, the wiring pattern disposed on the lower surface side of the light reflecting portion 292 is electrically connected to a detection circuit arranged outside the light emitting device 200. Then, a change in a resistance value of the wiring pattern is monitored by the detection circuit, and when the resistance value changes over a predetermined threshold, the destruction of the wavelength conversion member 290 can be detected.

Figure 5:
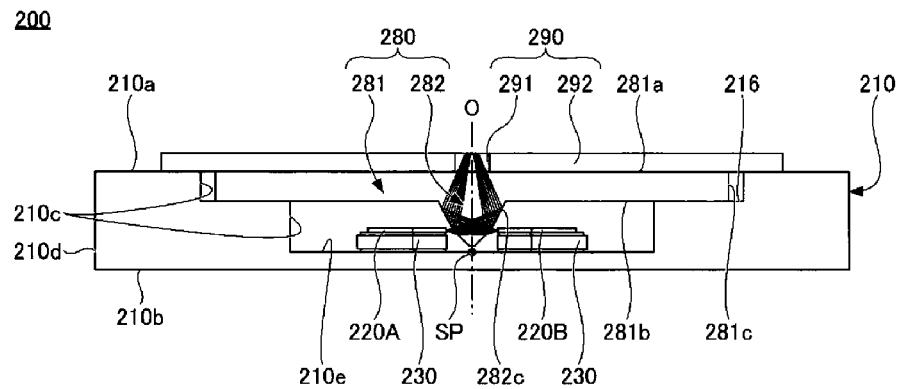
FIG. 5 is a view schematically illustrating travel of light when a semiconductor laser element emits the light.
Figure 6:
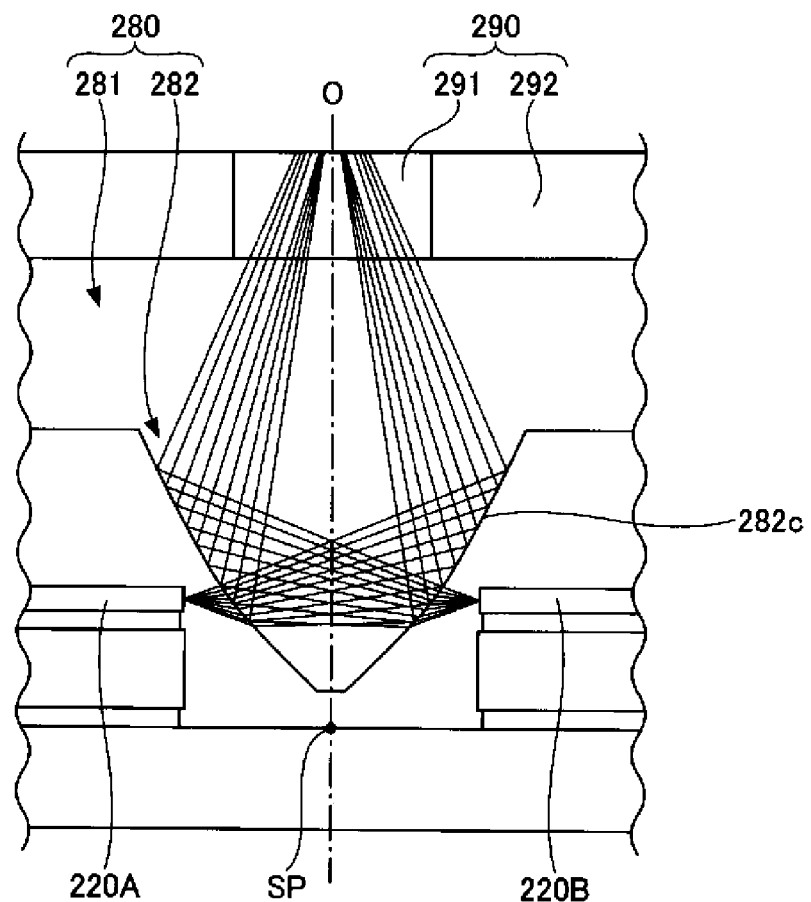
FIG. 6 is an enlarged view schematically showing the vicinity of a protrusion in FIG. 5.

FIG. 5 is a diagram schematically illustrating traveling of light when a semiconductor laser element emits the light. FIG. 6 is a schematic enlarged view of the vicinity of a protrusion in FIG. 5.

Light emitted from each of the emitting end surfaces of the four semiconductor laser elements including the first semiconductor laser element 220A and the second semiconductor laser element 220B illustrated in FIG. 5 and FIG. 6 enters the protrusion 282 through a boundary surface that is a boundary between the protrusion 282 and a peripheral environment of the protrusion 282. As used herein, the term "peripheral environment of the protrusion 282" refers to, for example, air, vacuum, or a specific gas other than air, and the lateral surface 282c serves as the boundary surface with the peripheral environment.

At the boundary surface of the protrusion 282, incident regions on each of which light from a respective one of the first semiconductor laser element 220A, the second semiconductor laser element 220B, the third semiconductor laser element 220C, and the fourth semiconductor laser element 220D is incident are separated from each other.

For example, in a plan view, an incident region on which the light from the first semiconductor laser element 220A is incident and an incident region on which the light from the second semiconductor laser element 220B is incident face each other across the central axis O. In addition, for example, in a plan view, an incident region on which the light from the third semiconductor laser element 220C is incident and an incident region on which the light from the fourth semiconductor laser element 220D is incident face each other across the central axis O.

At the boundary surface of the protrusion 282, it is preferable to dispose an antireflective film on the incident regions on each of which light from a respective one of the first semiconductor laser element 220A, the second semiconductor laser element 220B, the third semiconductor laser element 220C, and the fourth semiconductor laser element 220D is incident. This structure allows for reducing or preventing light from each of the semiconductor laser elements from being reflected at a respective incident region. For example, with the antireflective film, approximately 99.5% of the emitted light of each of the semiconductor laser elements can enter the protrusion 282. The antireflective film can be formed, for example, by layering one or more dielectric multilayer films such as $Nb_2O_5/SiO_2$, $Ta_2O_5/SiO_2$, $Al_2O_3/SiO_2$, $ZrO_2/SiO_2$, and $ZrO_2/Al_2O_3$. The antireflective film may be disposed on the entire lateral surface 282c of the protrusion 282.

Light from each of the semiconductor laser elements having entered the protrusion 282 through the incident region of the boundary surface is refracted slightly upward (on the cover portion 281 side) in the incident region of the boundary surface, travels straight, passes through the protrusion 282, and reaches the reflecting region of the boundary surface of the protrusion 282. For each of the semiconductor laser elements, the reflecting region is located, for example, at a position facing the incident region across the central axis O.

At the boundary surface of the protrusion 282, at least a portion of an incident region on which the light from the first semiconductor laser element 220A is incident also serves as a reflecting region on which the light emitted from the second semiconductor laser element 220B and incident on the protrusion 282 is reflected. In addition, at the boundary surface of the protrusion 282, at least a portion of an incident region on which the light from the second semiconductor laser element 220B is incident also serves as a reflecting region on which light emitted from the first semiconductor laser element 220A and incident on the protrusion 282 is reflected. This is similar for the third semiconductor laser element 220C and the fourth semiconductor laser element 220D.

Light emitted from the first semiconductor laser element 220A, light emitted from the second semiconductor laser element 220B, light emitted from the third semiconductor laser element 220C, and light emitted from the fourth semiconductor laser element 220D intersect each other between being incident on the boundary surface of the protrusion 282 and being reflected at the boundary surface of the protrusion 282.

For example, at least a portion of the light emitted from the first semiconductor laser element 220A and incident on the protrusion 282 intersects the light emitted from the second semiconductor laser element 220B and incident on the protrusion 282 before the portion of the light is reflected on the protrusion 282. In addition, at least a portion of the light emitted from the second semiconductor laser element 220B and incident on the protrusion 282 intersects the light emitted from the first semiconductor laser element 220A and incident on the protrusion 282 before the portion of the light is reflected on the protrusion 282. This is similar for the third semiconductor laser element 220C and the fourth semiconductor laser element 220D.

The light reaching the reflecting region of the boundary surface is reflected in the reflecting region, travels to the cover portion 281 side, and is transmitted through the cover portion 281. In a cross-sectional view, the reflecting surface has a curved-line shape curved toward outside the protrusion 282 and is inclined in a direction away from the central axis O from the upward-facing surface 210e side toward the cover portion 281 side. With the structure, light reflected on each reflecting surface becomes a convergent light, and, for example, travels in a direction approaching the central axis O. Lights reflected in respective reflecting regions may intersect with each other. In order that light reflected on the reflecting surface becomes a convergent light, the reflecting surface may have a polyhedral shape. In this case, the reflecting surface has a bent straight shape in a cross-sectional view.

The reflecting region preferably has an optical reflectance of 90% or greater with respect to the peak wavelength of the light reaching the reflecting region. It is more preferable that, the light reaching the reflecting region is totally reflected in the reflecting region due to a refractive index difference between the material of the protrusion 282 (for example, glass) and the peripheral environment (for example, air). By using total reflection, 99% or greater of the light emitted from the semiconductor laser element 220 can be incident on the wavelength conversion portion 291.

When the main material of the protrusion 282 is glass, the refractive index is approximately in a range from 1.4 to 1.8. In a case in which the peripheral environment is air, since the refractive index is 1, when the main material of the protrusion 282 is glass, total reflection can occur at the boundary surface between the protrusion 282 and air.

The light transmitted through the cover portion 281 is incident on the wavelength conversion portion 291 of the wavelength conversion member 290, and the wavelength conversion portion 291 converts a first light transmitted through the cover portion 281 into a second light having a different wavelength. The first light transmitted through the cover portion 281 and/or the second light wavelength-converted by the wavelength conversion portion 291 are emitted from the upper surface of the wavelength conversion portion 291 to the outside of the light emitting device 200.

When the heat generated by the wavelength conversion is concentrated at a specific location, efficiency of light conversion by the wavelength conversion portion 291 tends to be reduced. Accordingly, it is preferable that the distribution of the light incident on the wavelength conversion portion 291 is spread more uniformly. For example, portions having high light intensities of the laser lights emitted from each of the four semiconductor laser elements 220 preferably do not overlap each other. For example, adjustment in the degree of tilt and the curvature of the reflecting region of the boundary surface allows such control.

The light emitting device 200 can be used, for example, for an on-vehicle headlight. The light emitting device 200 may be used for other applications, and can be used for an illumination, a projector, a head-mounted display, and a light source such as a backlight of other display devices, etc.

As described above, in the light emitting device 200, a single protrusion 282 functioning as a mirror is provided on the lower surface 281b of the cover portion 281 so as to protrude toward the upward-facing surface 210e side of the base portion 210. This structure allows for obtaining the effects described below.

Each of the semiconductor laser elements is disposed on the upward-facing surface side of the light emitting device, and the mounting space of the mirror does not need to be provided on the upward-facing surface side of the light emitting device in contrast to a structure in which a single mirror is disposed for a single semiconductor laser element, so that the light emitting device can be miniaturized.

Also, in the light emitting device 200, the protrusion 282 and each semiconductor laser element 220 can be arranged close to each other to such an extent that they do not come into contact with each other, so that the spread of the light irradiated to the reflecting region can be reduced, which is advantageous for miniaturization.

In the light emitting device 200, with the distal end portion (end portion on the upward-facing surface 210e side) of the protrusion 282 located on the lower side (on the upward-facing surface 210e side) below the emission end surface of the semiconductor laser element 220, the height of the light emitting device 200 can be reduced.

Further, in the light emitting device 200, arranging the plurality of semiconductor laser elements 220 symmetrically with respect to the single protrusion 282 functioning as a mirror allows the light emitted from each of the semiconductor laser elements 220 to enter the protrusion 282 and then to be reflected. Thus, even when the number of semiconductor laser elements 220 is increased, the optical design can be facilitated.

In the light emitting device 200, light emitted from each of the semiconductor laser elements 220 is reflected at the single protrusion 282 functioning as a mirror, so that each optical path can be unified so as to be symmetrical with respect to the central axis of the mirror.

With the use of glass as a main material for a region of the cover portion 281 through which the light is transmitted and the protrusion 282 of glass, the polarization characteristics of the light emitted from the semiconductor laser element 220 can be maintained.

Causing total reflection on the protrusion 282 allows for improving the optical reflectance compared to using a reflecting surface of a mirror with a metal film, a dielectric multilayer film, and the like disposed on the reflecting surface in a conventional light emitting device.

Modified Example of First Embodiment

In a modified example of the first embodiment, an example of a light emitting device in which the number of semiconductor laser elements differs from that of the first embodiment will be described. In the modified example of the first embodiment, description of the same components as those of the above-described embodiment may be omitted.

Figure 7:
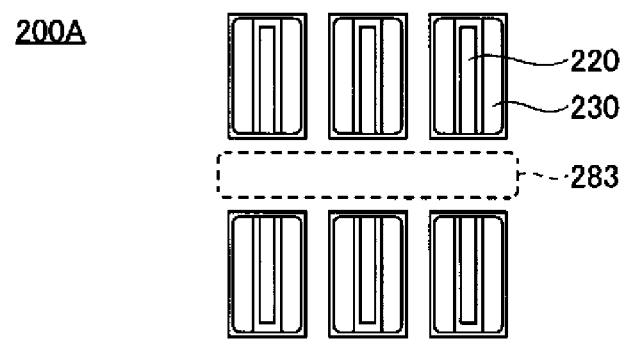
FIG. 7 is a schematic plan view (1) exemplifying a positional relationship between the semiconductor laser element and the protrusion.

FIG. 7 is a schematic plan view (1) exemplifying a positional relationship between a semiconductor laser element and a protrusion. As in the light emitting device 200A illustrated in FIG. 7, a protrusion 283 defining a rectangular planar shape may be provided on the lower surface of the cover portion, and each three semiconductor laser elements 220 may be arranged outward of a respective one of the long sides of the protrusion 283, the long sides facing each other, such that sets of three semiconductor laser elements 220 are separated from each other. For example, three pairs of semiconductor laser elements 220 are arranged such that the semiconductor laser elements 220 in each pair face each other across the protrusion 283. Increasing the length of the long sides of the protrusion 283, allows for arranging even more semiconductor laser elements 220.

The vertical cross-sectional shape in the short direction of the protrusion 283 is, for example, a conical shape or a truncated conical shape. The vertical cross-sectional shape in the longitudinal direction of the protrusion 283 is, for example, a rectangular shape.

Figure 8:
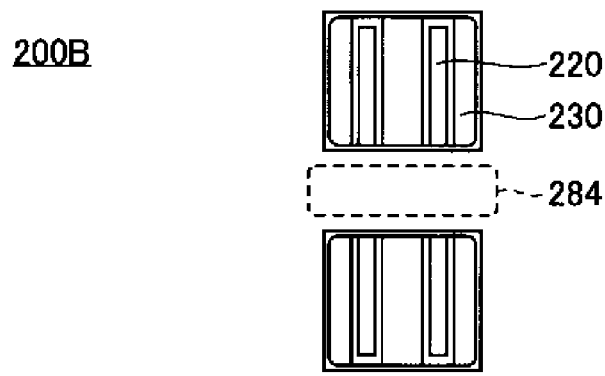
FIG. 8 is a schematic plan view (2) exemplifying the positional relationship between the semiconductor laser element and the protrusion.

FIG. 8 is a schematic plan view (2) exemplifying a positional relationship between a semiconductor laser element and a protrusion. As in the light emitting device 200B illustrated in FIG. 8, a protrusion 284 defining a rectangular planar shape may be provided on the lower surface of the cover portion, and each two semiconductor laser elements 220 may be arranged outside each of the long sides of the protrusion 284, the long sides facing each other, such that sets of two semiconductor laser elements 220 are separated from each other. For example, two pairs of semiconductor laser elements 220 are arranged such that the semiconductor laser elements 220 in each pair face each other across the protrusion 284 are arranged. The two semiconductor laser elements 220 arranged at the same long side of the protrusion 284 may be arranged on a single submount 230. This structure allows for miniaturizing the light emitting device.

The vertical cross-sectional shape in the short direction of the protrusion 284 is, for example, a conical shape or a truncated conical shape. The vertical cross-sectional shape in the longitudinal direction of the protrusion 284 is, for example, a rectangular shape.

Figure 9:
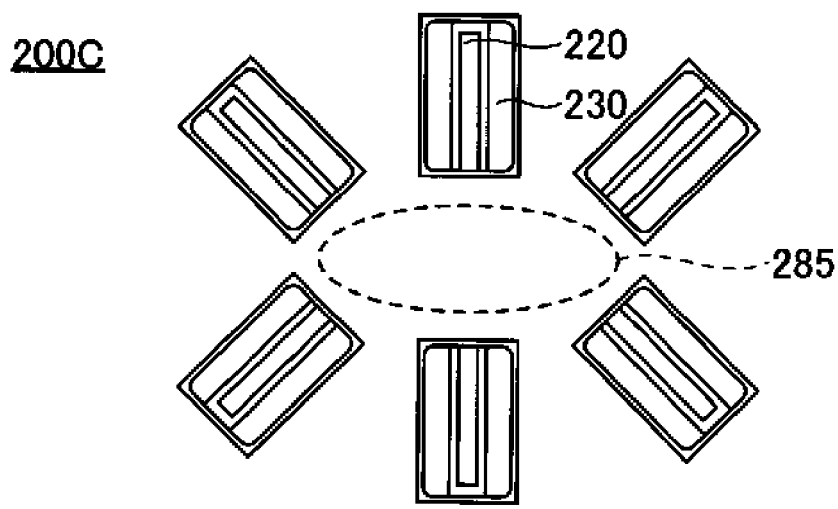
FIG. 9 is a schematic plan view (3) exemplifying the positional relationship between the semiconductor laser element and the protrusion.

FIG. 9 is a schematic plan view (3) exemplifying a positional relationship between a semiconductor laser element and a protrusion. As in the light emitting device 200C illustrated in FIG. 9, a protrusion 285 defining an elliptical planar shape may be provided on the lower surface of the cover portion, and six semiconductor laser elements 220 may be arranged along the periphery of the protrusion 285 to be separated from each other. For example, a pair of two semiconductor laser elements 220 are arranged to face each other across the protrusion 285, and, on both sides of each of the semiconductor laser elements 220 that face each other, two semiconductor laser elements 220 are arranged at an angle with respect to the semiconductor laser elements 220 facing each other.

The vertical cross-sectional shape in the short direction of the protrusion 285 is, for example, a conical shape or a truncated conical shape. The vertical cross-sectional shape in the longitudinal direction of the protrusion 285 is, for example, a conical shape or a truncated conical shape having the same height and a longer bottom surface with respect to that of the vertical cross-sectional shape in the short direction.

In this manner, selecting the shape of the protrusion provided on the lower surface side of the cover portion and the number and the arrangement of the semiconductor laser elements allows for obtaining various patterns of light distribution characteristics.

Second Embodiment

In a second embodiment, an example of a light emitting device including an optical member different from that of the first embodiment will be described. In the second embodiment, the description of the same components as those of the embodiment described above may be omitted.

Figure 10:
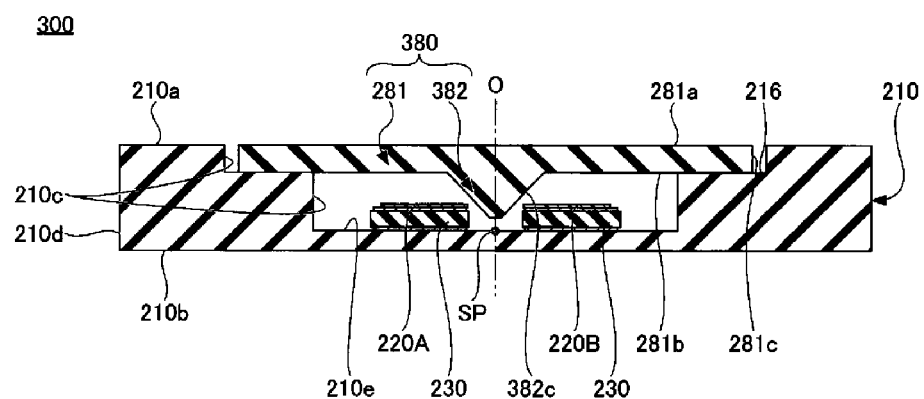
FIG. 10 is a schematic cross-sectional view exemplifying a light emitting device according to a second embodiment.
Figure 11:
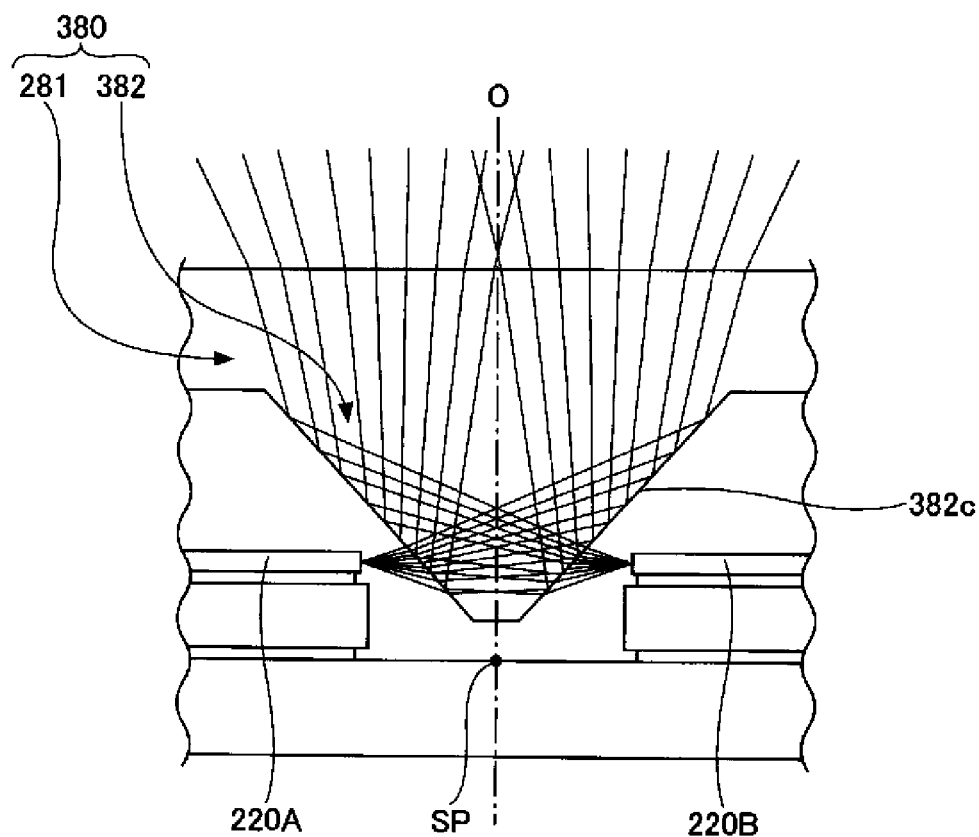
FIG. 11 is an enlarged view schematically showing the vicinity of a protrusion in FIG. 10 and schematically illustrating travel of light when a semiconductor laser element emits the light.

FIG. 10 is a schematic cross-sectional view exemplifying a light emitting device according to the second embodiment, illustrating a cross-section corresponding to FIG. 3. FIG. 11 is an enlarged view schematically showing the vicinity of the protrusion in FIG. 10 and schematically illustrates traveling of light when a semiconductor laser element emits the light.

As illustrated in FIG. 10 and FIG. 11, a light emitting device 300 differs from the light emitting device 200 (see FIG. 1 to FIG. 6) in that the light emitting device 300 does not include the wavelength conversion member 290 and that the optical member 280 is replaced by an optical member 380. A plan view of the light emitting device 300 in which the optical member 380 is removed is the same as FIG. 4. Because the light emitting device 300 does not include the wavelength conversion member 290, a step on which the wavelength conversion member 290 is to be disposed does not need to be formed in the base portion 210 of the light emitting device 300.

Optical Member 380

The optical member 380 includes a cover portion 281 and a protrusion 382. The protrusion 382 protrudes downward from a lower surface 281b of the cover portion 281. The protrusion 382 is a light-transmissive member including a bottom surface and a lateral surface 382c meeting the bottom surface and having a downward convex shape, and is rotationally symmetric with respect to the central axis O.

In the light emitting device 200, the protrusion 282 has a truncated conical shape, and the lateral surface 282c of the protrusion 282 has a curved shape curved toward outside the protrusion 282 in a cross-sectional view. In contrast, in the light emitting device 300, the protrusion 382 has a truncated conical shape, and the lateral surface 382c of the protrusion 382 has a straight-line shape in a cross-sectional view.

Similar to the optical member 280, in the optical member 380, the cover portion 281 and the protrusion 382 may be integrally formed, or may be separate bodies bonded by a light-transmissive adhesive and the like. Similarly to the protrusion 282, the protrusion 382 can be formed using, for example, glass as a main material.

Light Emitting Device 300

Light emitted from each of emission end surfaces of four semiconductor laser elements including a first semiconductor laser element 220A and a second semiconductor laser element 220B illustrated in FIG. 11 travels in the same manner as in the light emitting device 200 until the light reaches a reflecting region of a boundary surface. Meanwhile, in the light emitting device 300, light having reached the reflecting region of the boundary surface is reflected in the reflecting region to travel in a direction different from that in the light emitting device 200.

More specifically, in the light emitting device 200, the lateral surface 282c of the protrusion 282 has a curved shape curved toward outside the protrusion 282 in a cross-sectional view, so that light reaching the reflecting region of the boundary surface is reflected in the reflecting region having a curved shape and travels in a direction approaching the central axis O to converge. On the other hand, in the light emitting device 300, the lateral surface 382c of the protrusion 382 has a straight-line shape in a cross-sectional view, so that the light reaching the reflecting region of the boundary surface is reflected in the reflecting region having the straight shape and travels to the cover portion 281 side while diverging, and reaches the upper surface 281a of the cover portion 281.

The light reaching the upper surface 281a of the cover portion 281 is refracted at the boundary surface with the peripheral environment when being transmitted through the cover portion 281 and further diverges, and divergent light is emitted from the upper surface 281a of the cover portion 281. Because the light emitting device 300 does not include the wavelength conversion member 290, the divergent light emitted from the upper surface 281a of the cover portion 281 serves as the emitted light of the light emitting device 300.

The light emitting device 300 can be used for, for example, an on-vehicle headlight, an illumination, a projector, a head-mounted display, and a light source for other display devices and the like.

As described above, similarly to the light emitting device 200, in the light emitting device 300, a single protrusion 382 functioning as a mirror is defined on the lower surface 281b of the cover portion 281 to protrude toward the upward-facing surface 210e side of the base portion 210. With this structure, effects similar to those of the light emitting device 200 can be obtained, for example, the light emitting device can be miniaturized.

In the light emitting device 300, with the protrusion 382 having a truncated cone shape and the lateral surface 382c of the protrusion 382 having the straight-line shape in a cross-sectional view, the divergent light can be easily obtained.

Third Embodiment

In a third embodiment, an example of a light emitting device including a lens portion on a surface of the cover portion opposite to a surface on the semiconductor laser element side will be described. In the third embodiment, the description of the same components as those of the embodiments described above may be omitted.

Figure 12:
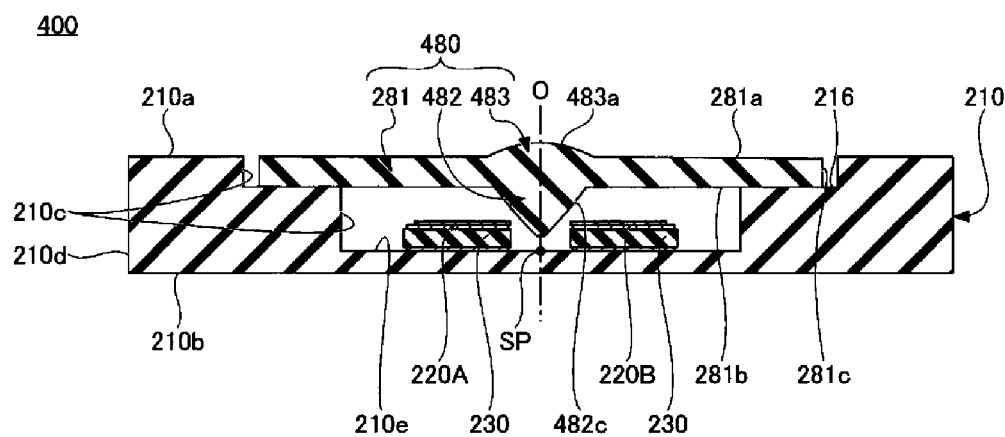
FIG. 12 is a schematic cross-sectional view exemplifying a light emitting device according to a third embodiment.
Figure 13:
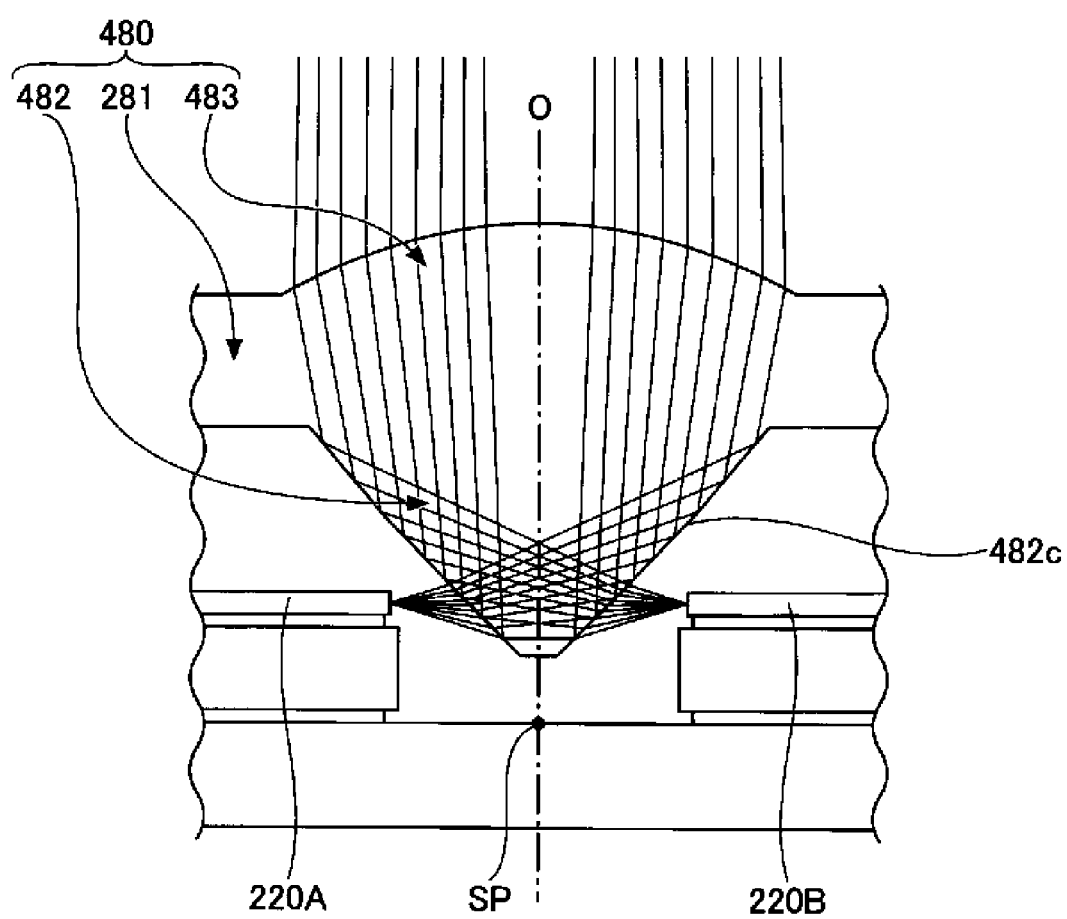
FIG. 13 is an enlarged view schematically showing the vicinity of a protrusion in FIG. 12 and schematically illustrating travel of light when a semiconductor laser element emits the light.

FIG. 12 is a schematic cross-sectional view exemplifying a light emitting device according to the third embodiment, illustrating a cross-section corresponding to FIG. 3. FIG. 13 is an enlarged view of the vicinity of the protrusion in FIG. 12 and schematically illustrates travel of light when a semiconductor laser element emits the light.

As illustrated in FIG. 12 and FIG. 13, a light emitting device 400 differs from the light emitting device 300 (see FIG. 10 and FIG. 11) in that the optical member 380 is replaced by the optical member 480.

Optical Member 480

The optical member 480 includes a cover portion 281, a protrusion 482, and a lens portion 483. The protrusion 482 protrudes downward from a lower surface 281b of the cover portion 281. The protrusion 482 is a light-transmissive member including a bottom surface and a lateral surface 482c meeting the bottom surface and having a downward convex shape, and is rotationally symmetric with respect to the central axis O.

Similarly to the protrusion 282 of the light emitting device 200, the protrusion 482 has a truncated conical shape, and the lateral surface 482c of the protrusion 482 has a curved shape curved toward outside the protrusion 482 in a cross-sectional view. Meanwhile, a curvature of the lateral surface 482c of the protrusion 482 is less than a curvature of the lateral surface 282c of the protrusion 282, and the lateral surface 482c has a gentle curve that is approximate to a straight line in a cross-sectional view.

The lens portion 483 is provided on the upper surface 281a of the cover portion 281. The lens portion 483 is, for example, a convex lens having a dome shape protruding upward from the upper surface 281a of the cover portion 281. A curved surface 483a of the lens portion 483 is, for example, an aspheric surface.

The lens portion 483 is located at a position overlapping with the protrusion 482 in a plan view. The central axis of the lens portion 483, for example, coincides with the central axis O. When both a planar shape of the lens portion 483 and a planar shape of the protrusion 482 are circular, the maximum diameter of the lens portion 483 (the diameter of the boundary portion with the upper surface 281a of the cover portion 281) is preferably greater than the maximum diameter of the protrusion 482 (the diameter of the boundary portion with the lower surface 281b of the cover portion 281).

In the optical member 480, the cover portion 281, the protrusion 482, and the lens portion 483 may all be integrally formed, or may be formed of separate bodies bonded together with a light-transmissive adhesive or the like. The protrusion 482 and the lens portion 483 can be formed using, for example, glass as a main material.

Light Emitting Device 400

Light emitted from each of emission end surfaces of four semiconductor laser elements including a first semiconductor laser element 220A and a second semiconductor laser element 220B illustrated in FIG. 13 reaches the reflecting region of a corresponding boundary surface as in the light emitting device 300. The light having reached the reflecting region of the boundary surface is reflected in the reflecting region having a curved shape that is approximate to straight line, travels to the cover portion 281 side while gently diverging, and reaches the curved surface 483a of the lens portion 483.

The light reaching the curved surface 483a of the lens portion 483 is refracted at the boundary surface with the peripheral environment to be parallel light when being transmitted through the lens portion 483, and the parallel light is emitted from the curved surface 483a of the lens portion 483. Because the light emitting device 400 does not include the wavelength conversion member 290, the parallel light emitted from the curved surface 483a of the lens portion 483 serves as an emitted light of the light emitting device 400.

The light emitting device 400 can be used for, for example, an on-vehicle headlight, an illumination, a projector, a head-mounted display, and a light source for other display devices and the like.

As described above, similarly to the light emitting device 200, in the light emitting device 400, a single protrusion 482 functioning as a mirror is defined on the lower surface 281b of the cover portion 281 to protrude toward the upward-facing surface 210e side of the base portion 210. With this structure, effects similar to those of the light emitting device 200 can be obtained, for example, the light emitting device can be miniaturized.

In the light emitting device 400, the lens portion 483 functions as a collimating lens, and can collectively collimate light emitted from the plurality of semiconductor laser elements 220. This allows for facilitating obtaining the parallel light from the light emitting device 400. The lens portion 483 may perform other optical control than collimating.

Fourth Embodiment

In a fourth embodiment, an example of a light emitting device in which semiconductor laser elements do not face each other will be described. In the fourth embodiment, the description of the same components as those of the embodiments described above may be omitted.

Figure 14:
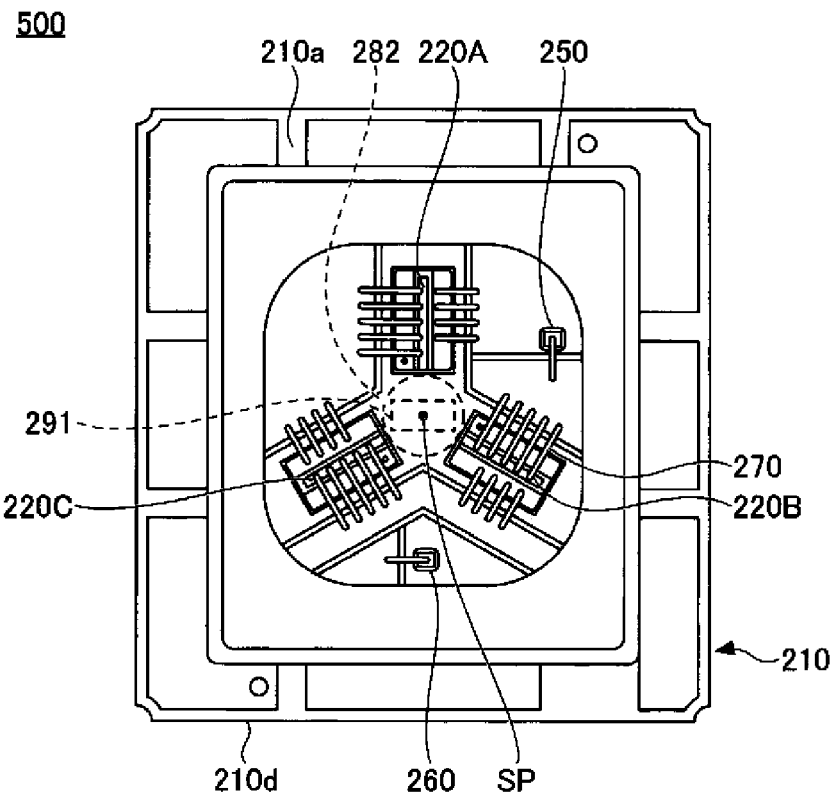
FIG. 14 is a schematic plan view exemplifying a light emitting device according to a fourth embodiment from which a wavelength conversion member and an optical member are removed.
Figure 15:
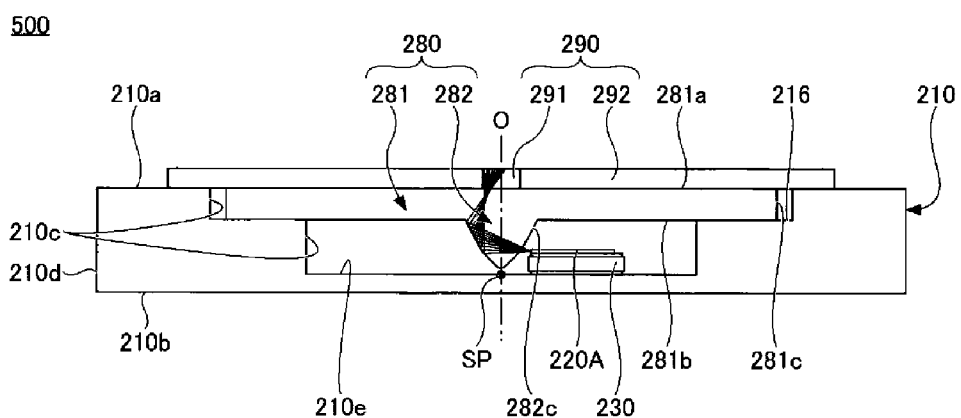
FIG. 15 is a view schematically illustrating travel of light when a semiconductor laser element emits the light.

A perspective view of the light emitting device according to the fourth embodiment is the same as FIG. 1, and a plan view of the light emitting device according to the fourth embodiment is the same as FIG. 2. FIG. 14 is a schematic plan view exemplifying a light emitting device according to the fourth embodiment from which a wavelength conversion member and an optical member are removed. In FIG. 14, for convenience, positions at which a protrusion 282 and a wavelength conversion portion 291 are projected are indicated by dashed lines. FIG. 15 is a view schematically illustrating traveling of light when a semiconductor laser element emits light. FIG. 15 illustrates a cross-section along a line passing through the center of the wavelength conversion portion 291 and parallel to a long side of the light reflecting portion 292 in FIG. 2.

As illustrated in FIG. 14 and FIG. 15, a light emitting device 500 differs from the light emitting device 200 (see FIG. 1 to FIG. 4) having four semiconductor laser elements in that the light emitting device 500 has three semiconductor laser elements. The light emitting device 500 includes a first semiconductor laser element 220A, a second semiconductor laser element 220B, and a third semiconductor laser element 220C.

In the light emitting device 500, the first semiconductor laser element 220A, the second semiconductor laser element 220B, and the third semiconductor laser element 220C do not face each other. The first semiconductor laser element 220A, the second semiconductor laser element 220B, and the third semiconductor laser element 220C are arranged, for example, to be three-fold rotationally symmetric about a point SP. In this case, in FIG. 14, if the first semiconductor laser element 220A, the second semiconductor laser element 220B, and the third semiconductor laser element 220C are rotated 120 degrees clockwise about the point SP, the first semiconductor laser element 220A is located at a previous position of the second semiconductor laser element 220B. Similarly, the second semiconductor laser element 220B and the third semiconductor laser element 220C is located at the previous positions of the third semiconductor laser element 220C and the first semiconductor laser element 220A, respectively.

Emission peak wavelengths of light emitted from the first semiconductor laser element 220A, the second semiconductor laser element 220B, and the third semiconductor laser element 220C may be the same or different. When the emission peak wavelengths of the light emitted from the first semiconductor laser element 220A, the second semiconductor laser element 220B, and the third semiconductor laser element 220C differ from each other, for example, the first semiconductor laser element 220A may have an emission peak wavelength corresponding to red, the second semiconductor laser element 220B may have an emission peak wavelength corresponding to green, and the third semiconductor laser element 220C may have an emission peak wavelength corresponding to blue.

Light emitted from each of emitting end surfaces of the first semiconductor laser element 220A, the second semiconductor laser element 220B, and the third semiconductor laser element 220C is enters the protrusion 282 through a boundary surface that is a boundary between the protrusion 282 and a peripheral environment of the protrusion 282. Light from each of the semiconductor laser elements having entered the protrusion 282 is refracted slightly upward (on the cover portion 281 side) in the incident region of the boundary surface, travels straight, passes through the protrusion 282, and reaches the reflecting region of the boundary surface of the protrusion 282. The light reaching the reflecting region of the boundary surface is reflected in the reflecting region, travels to the cover portion 281 side, and is transmitted through the cover portion 281. The light transmitted through the cover portion 281 is incident on the wavelength conversion portion 291 of the wavelength conversion member 290, and the wavelength conversion portion 291 converts a first light transmitted through the cover portion 281 into a second light having a different wavelength. The first light transmitted through the cover portion 281 and/or the second light wavelength-converted by the wavelength conversion portion 291 is emitted from the upper surface of the wavelength conversion portion 291 to the outside of the light emitting device 500.

As in the light emitting device 500, the semiconductor laser elements may be arranged such that the semiconductor laser elements do not face each other. Also with this structure, effects similar to those of the first embodiment, such as miniaturization of the light emitting device 500, can be obtained. Also in the second embodiment and the third embodiment, the number and the arrangement of the semiconductor laser elements can be the same as those in the fourth embodiment.

While certain embodiments and the like have been described in detail above, the present invention is not limited to the above-described embodiments and the like. Various modifications and substitutions can be made to the above-described embodiments and the like without departing from the scope described in the claims.

What is claimed is:

1. A light emitting device comprising:
    a base portion comprising:
        an upward-facing surface, and
        a frame defining an inner lateral surface;
    a plurality of semiconductor laser elements arranged on the upward-facing surface and surrounded by the frame;
    a cover portion supported by the frame and disposed above the plurality of semiconductor laser elements; and
    a protrusion extending from a lower surface of the cover portion toward the upward-facing surface, wherein:
    light emitted from each of the plurality of semiconductor laser elements is incident on a lateral surface of the protrusion, passes through the protrusion, is reflected at the lateral surface of the protrusion, and is transmitted through the cover portion, and
    in a side view, a virtual plane that includes and is parallel or tangential to the lateral surface on which the light is incident intersects a virtual plane that includes and is parallel to an emission end surface of one of the semiconductor laser elements.

2. The light emitting device according to claim 1, wherein the protrusion has a shape that increases in width from an upward-facing surface side to a cover portion side in a vertical cross-sectional view passing through a central axis of the protrusion.

3. The light emitting device of claim 2, wherein the protrusion has a conical shape or a truncated conical shape.

4. The light emitting device according to claim 1, wherein:
    the plurality of semiconductor laser elements includes a first semiconductor laser element and a second semiconductor laser element,
    at the lateral surface of the protrusion, at least a portion of an incident region on which the light from the first semiconductor laser element is incident serves also as a reflecting region on which the light incident on the protrusion from the second semiconductor laser element is reflected, and
    at least a portion of an incident region on which the light from the second semiconductor laser element is incident serves also as a reflecting region on which the light incident on the protrusion from the first semiconductor laser element is reflected.

5. The light emitting device according to claim 4, wherein, at the lateral surface of the protrusion, the incident region on which the light from the first semiconductor laser element is incident and the incident region on which the light from the second semiconductor laser element are separated from each other.

6. The light emitting device according to claim 4, wherein, in a plan view, when the upward-facing surface of the base portion is bisected by a virtual first straight line passing through the protrusion, the first semiconductor laser element is arranged in one of the bisected regions and the second semiconductor laser element is arranged in the other of the bisected regions, and
    a virtual second straight line connecting the first semiconductor laser element and the second semiconductor laser element passes through the protrusion.

7. The light emitting device according to claim 1, wherein lights emitted from the plurality of the semiconductor laser elements intersect each other between being incident on the lateral surface of the protrusion and being reflected at the lateral surface of the protrusion.

8. The light emitting device according to claim 1, wherein the plurality of semiconductor laser elements are arranged in point symmetry with respect to a center of the protrusion in a plan view.

9. The light emitting device according to claim 1, wherein the protrusion is formed using glass as a main material.

10. The light emitting device according to claim 1, wherein the cover portion and the protrusion are integrally formed.

11. The light emitting device according claim 1, wherein the light incident on the protrusion is totally reflected at the lateral surface of the protrusion.

12. The light emitting device according to claim 1, wherein, at the lateral surface of the protrusion, an anti-reflective film is disposed on an incident region on which the light from the plurality of semiconductor laser elements is to be incident.

13. The light emitting device according to claim 1, further comprising:
    a wavelength conversion portion disposed above the cover portion.

14. The light emitting device according to claim 1, further comprising:
    a lens portion on an upper surface of the cover portion.

15. A light emitting device comprising:
    a base portion comprising:
        an upward-facing surface, and
        a frame defining an inner lateral surface;
    a plurality of semiconductor laser elements arranged on the upward-facing surface and surrounded by the frame, the plurality of semiconductor laser elements including a first semiconductor laser element and a second semiconductor laser element;
    a cover portion supported by the frame and disposed above the plurality of semiconductor laser elements; and
    a protrusion extending from a lower surface of the cover portion toward the upward-facing surface, wherein:
    light emitted from each of the plurality of semiconductor laser elements is incident on a lateral surface of the protrusion, passes through the protrusion, is reflected at the lateral surface of the protrusion, and is transmitted through the cover portion, and
    light emitted from the first semiconductor laser element is emitted in a first direction and incident on the lateral surface of the protrusion, and light emitted from the second semiconductor laser element is emitted in a second direction different from the first direction and incident on the lateral surface of the protrusion.

16. The light emitting device according to claim 15, wherein, in a plan view, the first direction is diagonal to the second direction.

17. The light emitting device according to claim 15, wherein an angle between the first direction and the second direction is greater than or equal to 90 degrees.

18. A light emitting device comprising:
a base portion comprising:
  an upward-facing surface, and
  a frame defining an inner lateral surface;
a plurality of semiconductor laser elements arranged on the upward-facing surface and surrounded by the frame;
a cover portion supported by the frame and disposed above the plurality of semiconductor laser elements;
a protrusion extending from a lower surface of the cover portion toward the upward-facing surface; and
a lens portion protruding upward from an upper surface of the cover portion, wherein:
light emitted from each of the plurality of semiconductor laser elements is incident on a lateral surface of the protrusion, passes through the protrusion, is reflected at the lateral surface of the protrusion, and is transmitted through the cover portion.

19. The light emitting device according to claim 18, wherein the lens portion is monolithic with the cover portion.

20. A light emitting device comprising:
a base portion comprising:
  an upward-facing surface, and
  a frame defining an inner lateral surface;
a plurality of semiconductor laser elements arranged on the upward-facing surface and surrounded by the frame;
a cover portion supported by the frame and disposed above the plurality of semiconductor laser elements; and
a protrusion extending from a lower surface of the cover portion toward the upward-facing surface, wherein:
light emitted from each of the plurality of semiconductor laser elements is incident on a lateral surface of the protrusion, passes through the protrusion, is reflected at the lateral surface of the protrusion, and is transmitted through the cover portion, and
lights emitted from the plurality of the semiconductor laser elements intersect each other between being incident on the lateral surface of the protrusion and being reflected at the lateral surface of the protrusion.

* * * * *